United States Patent
Chang et al.

(10) Patent No.: US 7,611,825 B2
(45) Date of Patent: Nov. 3, 2009

(54) PHOTOLITHOGRAPHY METHOD TO PREVENT PHOTORESIST PATTERN COLLAPSE

(75) Inventors: Ching-Yu Chang, Yilang County (TW); Kuei Shun Chen, Hsin-Chu (TW); Bang-Ching Ho, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 460 days.

(21) Appl. No.: 10/942,499

(22) Filed: Sep. 15, 2004

(65) Prior Publication Data

US 2006/0057507 A1  Mar. 16, 2006

(51) Int. Cl.
*G03F 7/00* (2006.01)
(52) U.S. Cl. .......................... 430/311; 430/322; 430/327
(58) Field of Classification Search ........................ None
See application file for complete search history.

(56) References Cited

U.S. PATENT DOCUMENTS

| | | | |
|---|---|---|---|
| 6,451,510 B1 | 9/2002 | Messick et al. | |
| 6,551,888 B1 * | 4/2003 | Tabery et al. | 438/308 |
| 6,613,499 B2 | 9/2003 | Chang | |
| 6,696,326 B2 | 2/2004 | Zhang et al. | |
| 6,818,383 B2 * | 11/2004 | Kawai | 430/311 |
| 6,903,007 B1 * | 6/2005 | Foote et al. | 438/636 |
| 2002/0115022 A1 | 8/2002 | Messick et al. | |
| 2004/0053800 A1 | 3/2004 | Zhang et al. | |

OTHER PUBLICATIONS

"Resist Pattern Collapse Prevention For The Sub-90nm Node", Solid State Technology, Jul. 29, 2004, 6 pages.
Laura Peters, "Fine Today's Photoresists", Feb. 1, 2004, 7 pages.

* cited by examiner

*Primary Examiner*—John A McPherson
*Assistant Examiner*—Daborah Chacko Davis
(74) *Attorney, Agent, or Firm*—Haynes and Boone, LLP

(57) ABSTRACT

A method comprises forming a BARC layer on a substrate, treating the BARC layer to make its surface hydrophilic, forming a photoresist layer on the treated BARC layer, exposing the photoresist layer to a predetermined pattern, and developing the photoresist layer to form patterned photoresist.

26 Claims, 2 Drawing Sheets

PHOTOLITHOGRAPHY METHOD TO PREVENT PHOTORESIST PATTERN COLLAPSE

BACKGROUND

Photolithography is the production of a three-dimensional relief image based on a patterned exposure to light and a subsequent development of a light-sensitive photoresist on the wafer surface. As the dimensions of integrated circuit features continues to shrink along with the exposure wavelength, advances have been seen in photoresist material and other process technology. However, the problem of photoresist pattern collapse has been persistent and difficult to resolve. Photoresist pattern collapse is the problem of the very thin photoresist line patterns leaning or collapsing due to a number of factors. For example, one factor may be the poor adhesion between the photoresist material and the substrate or the bottom anti-reflective coating (BARC). Another factor contributing to photoresist pattern collapse may be a capillary force developed in the rinse water remaining between two adjacent photoresist lines.

DETAILED DESCRIPTION

The photolithography method described herein is applicable to the formation of patterns on a variety of substrates, and in particular for the formation of electronic devices with very small feature sizes. The method is applicable to the use of positive or negative photoresists.

Figure 1:
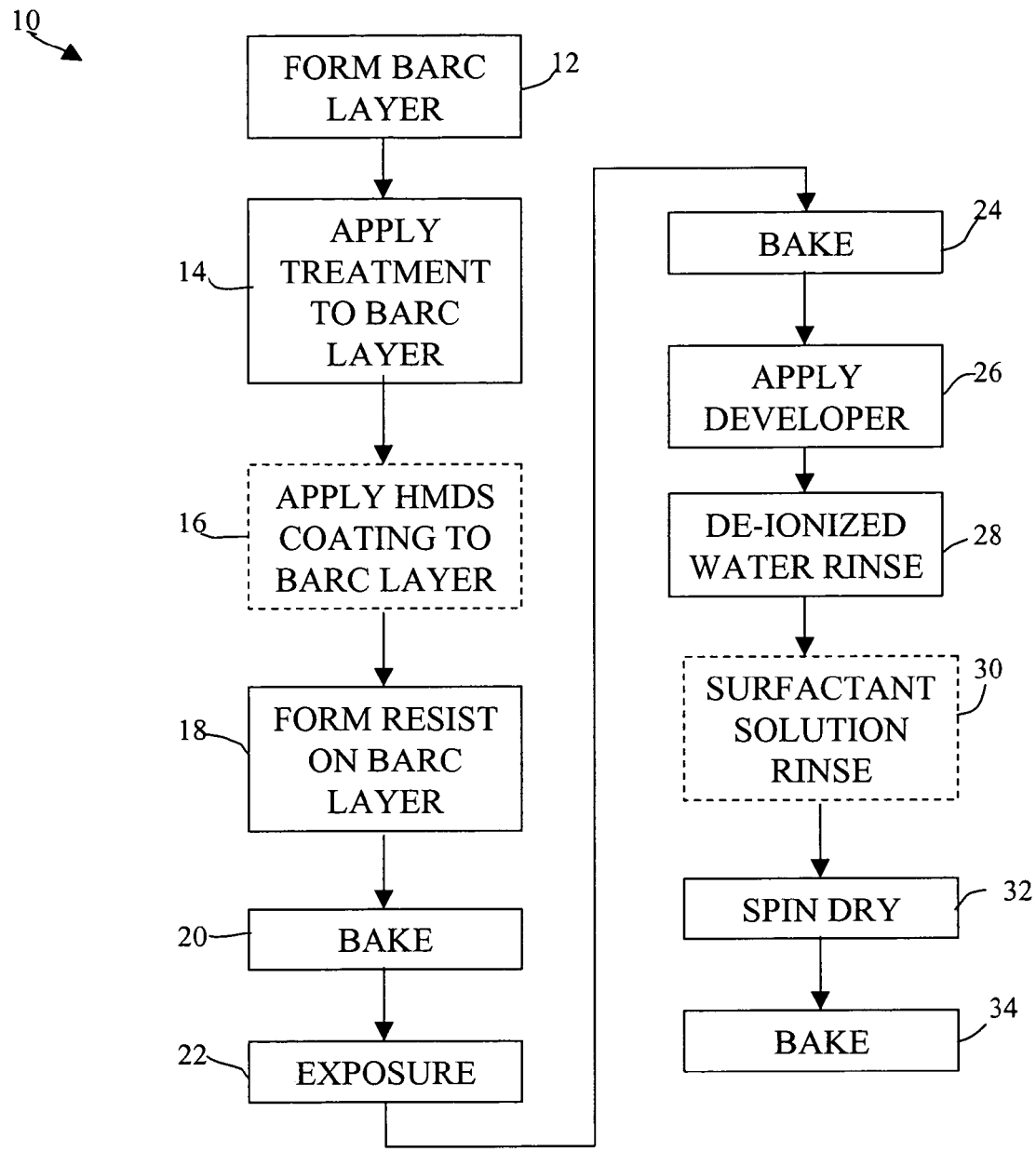
FIG. 1 is a simplified flowchart of an embodiment of a method for photolithography method to prevent photoresist pattern collapse.
Figure 2:
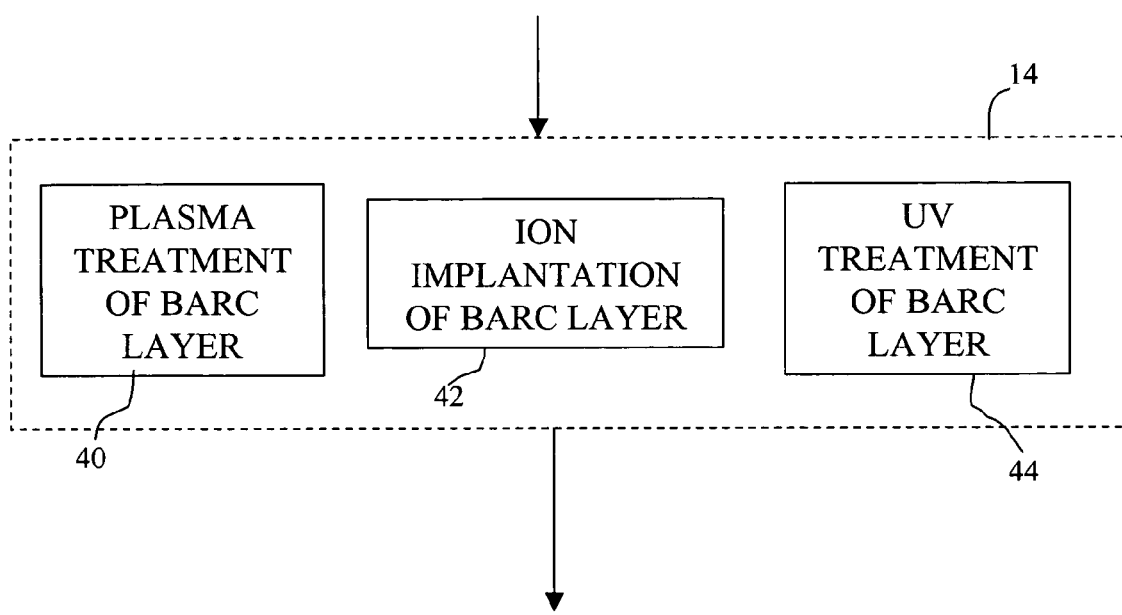
FIG. 2 is a simplified flowchart showing the embodiments of a treatment process for the bottom anti-reflective coating (BARC) layer.

FIG. 1 is a simplified flowchart of an embodiment of a method for photolithography 10 to prevent photoresist pattern collapse. In step 12, a bottom anti-reflective coating (BARC) layer is formed upon a wafer substrate. The substrate may be of a semiconductor material but may be other suitable materials for other applications. The use of a BARC layer in advanced photolithography enhances the control of critical dimensions (CD) by suppressing reflective notching, standing waves effects and the swing ratio caused by thin film interference. In step 14, a special treatment is applied to the BARC layer. More specifically, the special treatment in step 14 is operable to change the hydrophobic property of the BARC layer to a hydrophilic property. It further enhances the adhesion of the photoresist to the BARC layer. The treatment also increases the micro roughness of the film and the adhesion with the photoresist. As shown in more detail in FIG. 2, the special treatment may include a plasma treatment 40, an ion implantation process 42, exposure to ultraviolet light 44, a combination of any of these treatments, or a combination of these treatments and other suitable processes in order to make the BARC layer hydrophilic.

In particular, the plasma treatment 40 of the BARC layer may be performed under suitable conditions. A number of suitable plasma gases may be used, such as $N_2$, Ar, CO, $F_4$, $O_2$, Ne, $Br_2$, a fluorine-containing gas, a carbon-containing gas, a chlorine-containing gas, or a combination of these gases. The gas flow rate may range from about 50 to about 1000 sccm. The pressure in the plasma chamber may range from about 10 to about 500 mTorr. The reaction power of the plasma chamber may range about 100 to about 800 Watts. The above-described plasma treatment settings are given merely as examples and should not be used to unduly limit the scope and application of this process.

The plasma treatment may be applied to the BARC layer alone or in combination with the ion implantation process and/or the ultraviolet exposure process. The ion implantation process is also operable to change the hydrophobic nature of the BARC layer, and further enhance at least the adhesion of the photoresist to the BARC layer. The ions implanted may include dopants such as nitrogen, argon, helium, phosphorous, arsenic, boron, silicon, and hydrogen, for example. The dosage of implanted ions may range from about $1\,e^{10}$ to about $1\,e^{20}\,cm^{-2}$, for example. The implantation energy may range from about 1 to about 200 keV, for example. The above-described ion implantation settings are given merely as examples and should not be used to unduly limit the scope and application of this process.

Another alternative treatment process of the BARC layer to enhance the adhesion between it and the photoresist and to improve its hydrophilic properties is exposure to ultraviolet light. For example, the BARC layer may be exposed to ultraviolet light ranging in wavelength from about 150 nm to about 480 nm. Other wavelengths may be used if they also achieve the desired function and/or objectives.

After the special treatment to the BARC layer in step 14, an optional step 16 of applying a hexamethyldisilazane (HMDS) coating to the BARC layer may be performed. This step further enhances the adhesion of a photoresist to the underlying BARC layer.

In step 18, a photoresist film is formed on the BARC layer. In step 20, the wafer is then heated or baked at a temperature ranging from about 90° C. to about 150° C., for example for several seconds to densify the photoresist polymer and to evaporate solvents. In step 22, the photoresist is exposed to light of a predetermined wavelength through patterns of a mask. The mask pattern is thus transferred to the photoresist. The exposed photoresist is then heated or baked in step 24 for at about 70° C. to about 150° C. for one to two minutes, for example, to amplify the latent image and for polymer cleavage. A developer is then applied to the photoresist in step 26. The exposure time of the photoresist to the developer solution may be dependent on the composition of the developer solution and may range from about one minute to about three minutes. The developer solution may be an aqueous tetramethylammonium hydroxide (TMAH) solution, for example. Other suitable developer solutions now known or later developed may also be used. For example, the developer solution may also comprise a surfactant such as an alkali anionic surfactant, an anionic phosphate sufactant, or a non-ionic surfactant, for example. The developer solution may be applied in a number of ways, such as being dripped onto the photoresist surface to form a puddle, the wafer may be dipped into a developer solution bath, or the developer solution may be sprayed onto the photoresist. The exposed photoresist, which is soluble in the developer solution, is then removed and a patterned photoresist layer is thus formed. A de-ionized water rinse is then performed in step 28 to remove the dissolved polymer. An optional surfactant solution rinse may follow the de-ionized water rinse in step 30. The wafer may then be spun dry in step 32. An optional bake step may be performed in step 34 to remove any residual moisture on the photoresist surface. Thereafter, the wafer with the photoresist may then be used to form thin line features on the surface of the wafer.

Using the above-described method, the adhesion between the BARC layer and the photoresist layer is improved. Because the treated BARC layer is hydrophilic, the hydrophilic lateral sides of the photoresist lines no longer induce capillary water formations between adjacent photoresist lines. Therefore, defects such as pattern collapse due to the shrinkage of water and developer film formed between adjacent photoresist lines are avoided. The hydrophilic surface of the BARC layer also prevents the formation of the watermarks formed on the BARC surface after the spin dry step. Unlike other methods introduced to resolve the photoresist pattern collapse problem, this method does not require modifications to hardware, new BARC materials, or new process chemicals. This method also does not impact the integration rule, change the critical dimension or overlay specifications, or change the exposure conditions and the mask.

Although the above description specifically describes the treatment of a BARC layer, the method may be similarly applicable to the treatment of another type of material disposed between the substrate and the photoresist film.

What is claimed is:

1. A method, comprising:
    forming an intermediary material layer on a substrate, wherein forming the intermediary material layer comprises forming an organic bottom anti-reflective coating layer;
    treating the intermediary material layer to make its surface substantially hydrophilic, thereby forming a treated intermediary material layer, wherein the treating the intermediary material layer includes at least one of a plasma treatment, an exposure to ultraviolet radiation, and a ion implantation treatment;
    thereafter forming a photoresist layer directly on the treated intermediary material, wherein the forming the photoresist layer includes forming an interface between the photoresist layer and the surface of the treated intermediary material layer;
    exposing the photoresist layer to a predetermined pattern; and
    developing the photoresist layer to form patterned photoresist.

2. The method of claim 1, wherein forming the intermediary material layer comprises forming a hydrophobic material layer.

3. The method of claim 1, wherein treating the intermediary material layer comprises exposing the intermediary material layer to a plasma.

4. The method of claim 1, wherein treating the intermediary material layer comprises exposing the intermediary material layer to plasma gases selected from the group consisting of $N_2$, Ar, CO, $F_4$, $O_2$, Ne, $Br_2$, a fluorine-containing gas, a carbon-containing gas, a chlorine-containing gas, and a combination thereof.

5. The method of claim 1, wherein treating the intermediary material layer comprises exposing the intermediary material layer to a plasma gas atmosphere with a gas flow rate ranging from about 50 to about 1000 sccm, at a pressure ranging from about 10 to about 500 mTorr.

6. The method of claim 1, wherein treating the intermediary material layer comprises exposing the intermediary material layer to ultraviolet radiation.

7. The method of claim 1, wherein treating the intermediary material layer comprises exposing the intermediary material layer to ultraviolet radiation having a wavelength ranging from about 150 nm to about 480 nm.

8. The method of claim 1, wherein treating the intermediary material layer comprises implanting ions of a predetermined species in the intermediary material layer.

9. The method of claim 1, wherein treating the intermediary material layer comprises implanting ions of a predetermined species in the intermediary material layer, the ion species selected from the group consisting of nitrogen, argon, helium, phosphorous, arsenic, boron, silicon, and hydrogen.

10. The method of claim 1, wherein treating the intermediary material layer comprises implanting ions of a predetermined dosage ranging from about $1e^{10}$ to about $1e^{20}$ $cm^{-2}$ in the intermediary material layer.

11. The method of claim 1, wherein treating the intermediary material layer comprises implanting ions at a predetermined energy ranging from about 1 to about 200 keV in the intermediary material layer.

12. The method of claim 1, wherein developing the photoresist comprises applying a developer to the treated intermediary material layer.

13. The method of claim 1, wherein developing the photoresist comprises puddling an aqueous developer solution on the surface of the photoresist.

14. The method of claim 1, wherein developing the photoresist comprises spraying an aqueous developer solution on the surface of the photoresist.

15. The method of claim 1, wherein developing the photoresist comprises immersing the photoresist surface in an aqueous developer solution bath.

16. The method of claim 1, further comprising rinsing the developed photoresist with a rinse solution.

17. The method of claim 1, further comprising rinsing the developed photoresist with de-ionized water.

18. The method of claim 1, wherein treating the intermediary material layer comprises plasma treatment and ion implantation.

19. The method of claim 1, wherein treating the intermediary material layer comprises plasma treatment and ultraviolet radiation.

20. The method of claim 1, wherein treating the intermediary material layer comprises ultraviolet radiation and ion implantation.

21. The method of claim 1, wherein treating the intermediary material layer comprises plasma treatment, ion implantation, and ultraviolet radiation.

22. A method, comprising:
    forming an intermediary material layer on a substrate, wherein forming the intermediary material layer comprises forming an organic bottom anti-reflective coating layer;
    treating the intermediary material layer to make its surface substantially hydrophilic, wherein the treating the intermediary material layer includes at least one of a plasma, an ion implantation, and a UV radiation;
    after treating the intermediary layer, forming a hexamethyldisilazane (HMDS) coating on the treated intermediary material layer; and
    forming a photoresist layer on the HMDS coating.

23. A method, comprising:
    forming an organic BARC layer on a substrate;
    exposing the BARC layer to a plasma to make its surface substantially hydrophilic;
    forming a photoresist layer directly on the exposed BARC layer;
    exposing the photoresist layer to a predetermined pattern; and
    developing the photoresist layer to form patterned photoresist.

24. A method, comprising:

forming a BARC layer on a semiconductor substrate;

exposing the BARC layer to ultraviolet radiation to make its surface substantially hydrophilic, wherein the exposing the BARC includes exposing to a first radiation beam;

forming a photoresist layer directly on the exposed BARC layer, wherein the forming the photoresist layer is performed after the exposing the BARC layer to ultraviolet radiation;

exposing the photoresist layer to a predetermined pattern, wherein the exposing the photoresist uses a second radiation beam; and developing the photoresist layer to form patterned photoresist.

25. A method, comprising:

forming a BARC layer on a substrate;

treating the BARC layer, wherein the treating comprises implanting ions in the BARC layer to make its surface substantially hydrophilic, wherein the ions are selected from the group consisting of nitrogen, argon, helium, phosphorous, arsenic, boron, silicon, and hydrogen, wherein the treating is performed on the entire surface of the BARC layer;

forming a photoresist layer on the treated BARC layer;

exposing the photoresist layer to a predetermined pattern; and developing the photoresist layer to form patterned photoresist.

26. A method, comprising:

forming an organic BARC layer on a substrate;

treating the BARC layer the treating including exposing the BARC layer to a plasma to make its surface substantially hydrophilic and rough;

forming a photoresist layer on the treated BARC layer;

exposing the photoresist layer to a predetermined pattern; and developing the photoresist layer to form patterned photoresist.

* * * * *